United States Patent
Every

(10) Patent No.: US 10,153,744 B1
(45) Date of Patent: Dec. 11, 2018

(54) AUTOMATICALLY TUNING AN AUDIO COMPRESSOR TO PREVENT DISTORTION

(71) Applicant: 2236008 Ontario Inc., Waterloo (CA)

(72) Inventor: Mark Robert Every, Surrey (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 0 days.

(21) Appl. No.: 15/667,386

(22) Filed: Aug. 2, 2017

(51) Int. Cl.

| | |
|---|---|
| *H04R 3/00* | (2006.01) |
| *H03G 3/20* | (2006.01) |
| *H03G 9/18* | (2006.01) |
| *H04M 9/08* | (2006.01) |
| *H04S 7/00* | (2006.01) |
| *H04R 3/04* | (2006.01) |
| *H04R 29/00* | (2006.01) |
| *H03G 7/00* | (2006.01) |

(52) U.S. Cl.
CPC ............... *H03G 3/20* (2013.01); *H03G 9/18* (2013.01); *H04M 9/082* (2013.01); *H04R 3/04* (2013.01); *H04S 7/301* (2013.01); *H03G 7/002* (2013.01); *H04R 29/001* (2013.01)

(58) Field of Classification Search
CPC .......... H03G 3/20; H03G 9/18; H04M 9/082; H04R 3/04
See application file for complete search history.

(56) References Cited

U.S. PATENT DOCUMENTS

| | | | |
|---|---|---|---|
| 5,255,324 A | 10/1993 | Brewer et al. | |
| 6,760,452 B2 | 7/2004 | Lau et al. | |
| 7,209,566 B2 | 4/2007 | Griniasty | |
| 7,894,598 B2 | 2/2011 | Schmidt et al. | |
| 9,130,527 B2 | 9/2015 | Potard | |
| 2013/0142360 A1* | 6/2013 | Potard | H03G 9/18 |
| | | | 381/98 |
| 2016/0029124 A1* | 1/2016 | Paranjpe | G10K 11/178 |
| | | | 381/71.14 |

FOREIGN PATENT DOCUMENTS

| | | |
|---|---|---|
| WO | WO 03/028406 A2 | 4/2003 |
| WO | WO 2005/107319 A1 | 11/2005 |
| WO | WO 2007/110476 A1 | 10/2007 |

* cited by examiner

*Primary Examiner* — Simon King
(74) *Attorney, Agent, or Firm* — Rowand LLP

(57) ABSTRACT

A system and method automates the tuning of one or more multiband compressors or multiband limiters to minimize loudspeaker distortion. The system and method render one or more test loudspeaker signals that vary in frequency and in amplitude out of a loudspeaker and records the responses of the loudspeaker at a microphone. The system and method measure a distortion of the loudspeaker, relative to a frequency and an amplitude, with respect to the one or more test loudspeaker signals and a microphone signal and calculate tunable parameters of the multiband compressor that includes cutoff frequencies in response to the measured distortion.

20 Claims, 4 Drawing Sheets

AUTOMATICALLY TUNING AN AUDIO COMPRESSOR TO PREVENT DISTORTION

BACKGROUND OF THE DISCLOSURE

1. Technical Field

This disclosure relates to audio distortion and in particular, to systems and methods that prevent audio distortion by automatically tuning full band and multiband compressors and limiters.

2. Related Art

The fidelity and reproduction of audio signals can depend on the quality of loudspeakers and microphones. A low-quality loudspeaker or microphone may introduce non-linear distortion that changes audio signals and results in imperfections. Non-linear distortion reduces the sound quality of an audio reproduction.

BRIEF DESCRIPTION OF THE DRAWINGS

The disclosure is better understood with reference to the following drawings and description. The elements in the figures are not necessarily to scale, emphasis instead being placed upon illustrating the principles of the disclosure. Moreover, in the figures, like referenced numerals designate corresponding parts throughout the different views.

DETAILED DESCRIPTION

Figure 1:
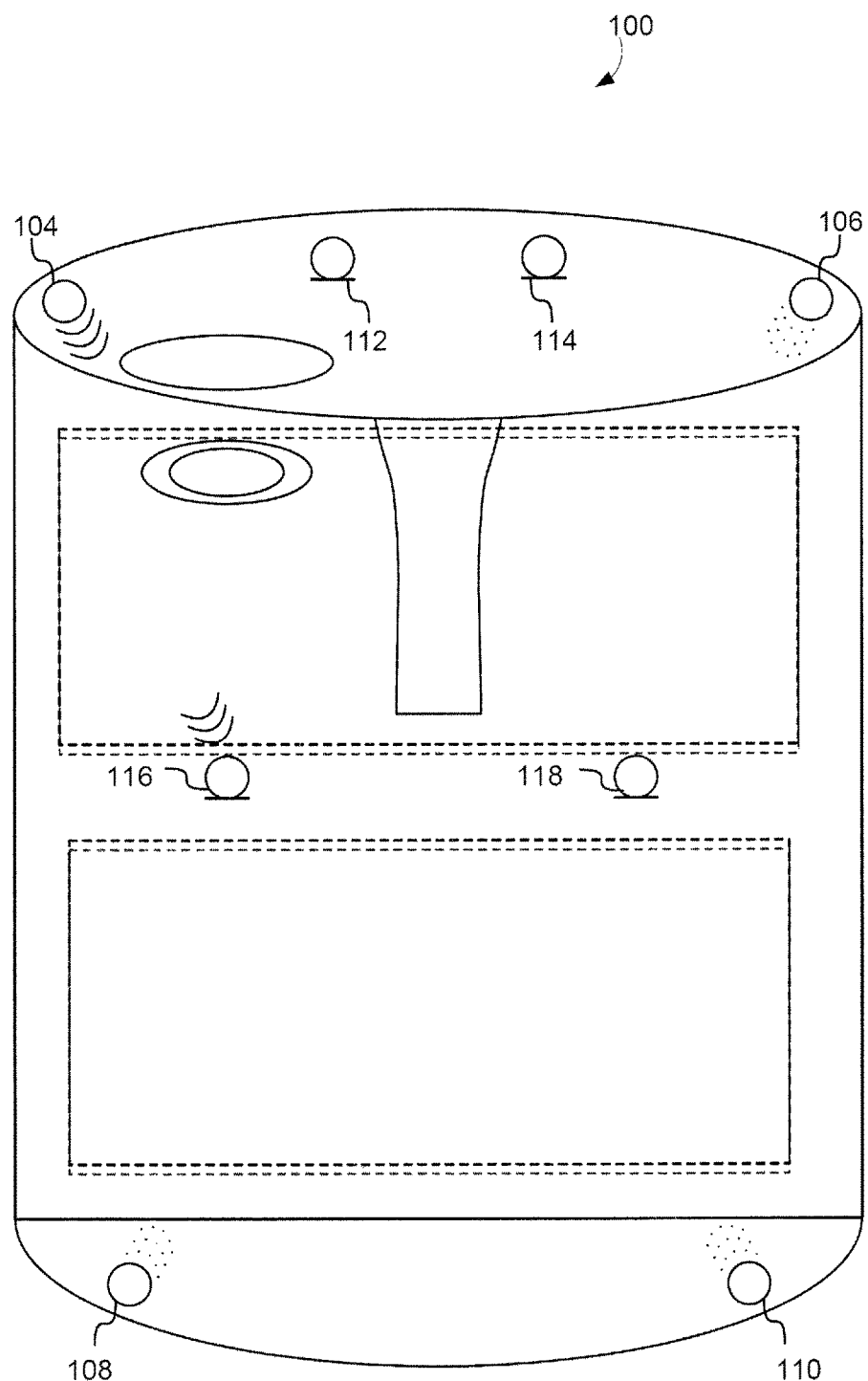
FIG. 1 is an overhead view of a vehicle executing an automated tuning.

The causes of non-linear loudspeaker distortion are complex. Some are caused by changing electrical impedances of loudspeaker components, resistant loudspeaker suspensions, bending of loudspeaker cones, back electromotive force (EMF), or Doppler shift. The unwanted effects of non-linear distortion can change the fidelity of an audio signal making it unpleasant to listen to, difficult to understand in the case of voice signals, or difficult to perform post processing. Music played from a distorting loudspeaker may sound harsh, muffled, tiny or metallic, for example. An Acoustic Echo Canceller (AEC) post process, for example, reduces estimated echo on a microphone signal and operates on the assumption that the echo is linearly related to the loudspeaker input signal. Non-linear distortion rendered by a loudspeaker can violate an AEC's linear assumption and result in echo leakage, i.e. only partial cancellation of the echo, which results in some echo components being leaked through to a listener, for example, on the far-end of a hands-free call.

Generally, loudspeaker distortion tends to increase when the signal driving the loudspeaker increases in level, and there is an operating range within which the loudspeaker behaves roughly linearly. To ensure that systems operate in a linear range, non-linear compression may limit loudspeaker signals. Non-linear compression may encompass full band or multiband limiters, and full band or multiband compressors. A multiband limiter or compressor divides the frequency spectrum of the input signal into two or more different sections or bands, and performs limiting or compression on each band individually. Each band may have its own unique compression or limiter parameters. The limited or compressed bands are then recombined to form the processed output signal. A full band limiter or compressor performs limiting or compression directly on the input signal.

A multiband limiter or compressor makes it possible to compress or limit an audio signal to tailor the compression or loudness to the loudspeakers that reproduce a signal. For example, if a loudspeaker primarily distorts due to low-frequency high-level components of the loudspeaker signal, a multiband limiter may split the loudspeaker signal into low frequency and high-frequency bands, limit the low-frequency band to an acceptable level, recombine the two bands, and send the processed signal to the loudspeaker. Thus, the high frequencies in the signal are left relatively unaffected, and the compressor or limiter performs only the minimum modifications to the signal that are needed to prevent distortion.

To effectively compress or limit different sections of the frequency spectrum many parameters are tuned. In a multiband compressor, one or more crossover frequencies, amplitude thresholds, compression ratios, time constants, attack and release times, look-ahead parameters, etc. may require tuning. Because tuning requires considerable audio expertise, time and subjective evaluations to manually tune the parameters of a compressor or limiter, tuning is cost-prohibitive and is not always done effectively or completely. For example, tuning a multiband limiter or compressor for the loudspeakers in a vehicle cabin may take several hours or days, and this must be repeated for every vehicle make, model and trim level.

The automated system and method (referred to as the system) automatically tunes one or more multiband limiters and/or compressors by generating and sweeping test signals through one or more loudspeakers and measuring the one or more loudspeakers response at one or more microphones. The sweep signals may include pure tones, sweeps and noise bursts that vary in frequency and in amplitude. The system may determine the number of bands, crossover frequencies, thresholds, etc. that are required to maximize the perceived quality of the signals reproduced from the loudspeakers.

The automated system generates and passes a sinusoidal sweep signal with time-varying frequency "f1(n)" as a function of time "n" through one of the one or more transducers or loudspeakers 104-106 (hereinafter referred to as loudspeakers), and captures the response at one of the one or more reference microphones 112-118 as shown in the vehicle 100 of FIG. 1. Harmonic distortion components may appear in the captured signal at products of the fundamental frequency, as expressed by equation 1.

$$f2(n)=2*f1(n), f3(n)=3*f1(n), \qquad \text{Eq. 1}$$

Intermodulation distortion may occur at sum and difference frequencies when more than one sinusoidal tone passes through an active loudspeaker 104 (e.g., a loudspeaker rendering sound). Various metrics may be used to characterize the distortion rendered by the active loudspeaker 104. These metrics include one or more of a Total Harmonic Distortion (THD), a Total Harmonic Distortion Plus Noise (THD+N), a Signal to Noise Ratio (SNR) and a maximum Sound Pressure Level (SPL). THD+N measures the harmonic distortion plus noise power sum across the frequency spectrum relative to the power at the fundamental frequency "f1 (n)". In operation, a THD+N measurement of less than about one percent may indicate that the active loudspeaker 104 is operating in a linear range and distortion is unlikely to be perceived. A THD+N measurement of greater than about ten percent may identify perceivable distortion.

With increasing amplitude levels of the sinusoidal sweep signal, a loudspeaker's distortion tends to increase. In this system, an upper limit for harmonic distortion plus noise (THD+N) is denoted by D(f). Below the upper limit, distortion is inaudible or does not affect post processing, for example an AEC or feedback cancellation process. The upper limit may be frequency-dependent, or a scalar, e.g. 1%. As a function of frequency "f", A(f) is the maximum sinusoidal amplitude output from the active loudspeaker subject to THD+N<D(f) constraint. In other words, as long as the signal rendered by the loudspeaker as a function of frequency is less than A(f), the loudspeaker should not distort significantly. This is referred to as the distortion constraint. This is determined be passing sinusoidal sweep signals or other test loudspeaker signals of increasing amplitude through the loudspeaker, starting from a low amplitude signal where distortion is absent, to a high amplitude signal where distortion exceeds D(f). With this constraint, the system tunes one or more multiband limiters/compressor parameters automatically such that the output amplitude at frequency "f" is less than A(f).

Compressors or limiters often reduce the perceived loudness of the reproduced signals at high input signal levels. In applications that are integrated within or are a unitary part of an earpiece, a mobile phone, or loudspeaker that may be used in an infotainment system of a vehicle, achieving sufficient loudness from the transducer may be one objective. Thus, this system tunes one or more compressors and/or limiters such that the reduction in loudness is minimized. Accordingly, the system automates the tuning of separate bands whose bandwidth may be set by adjusting the crossover frequencies of the multiband compressors/multiband limiters by programming parameters. The crossover frequencies and limiter thresholds are adjusted automatically to minimize the loudness reduction subject to the distortion constraint.

An exemplary multiband limiter with "B" bands may be programmed to have B−1 crossover frequencies fc_1, fc_2, . . . fc_(B−1). The magnitude response of the filter that produces band "b" from the input signal is denoted as H_b(f). This filter may be a Finite Impulse Response (FIR) or Infinite Impulse Response (IIR) filter. The band filters are designed such that the overall response of the multiband limiter (i.e. summing over bands) is roughly flat as expressed by equation 2.

$$\text{Sum}\_b H\_b(f)=1 \text{ for all } f \qquad \text{Eq. 2}$$

Figure 2:
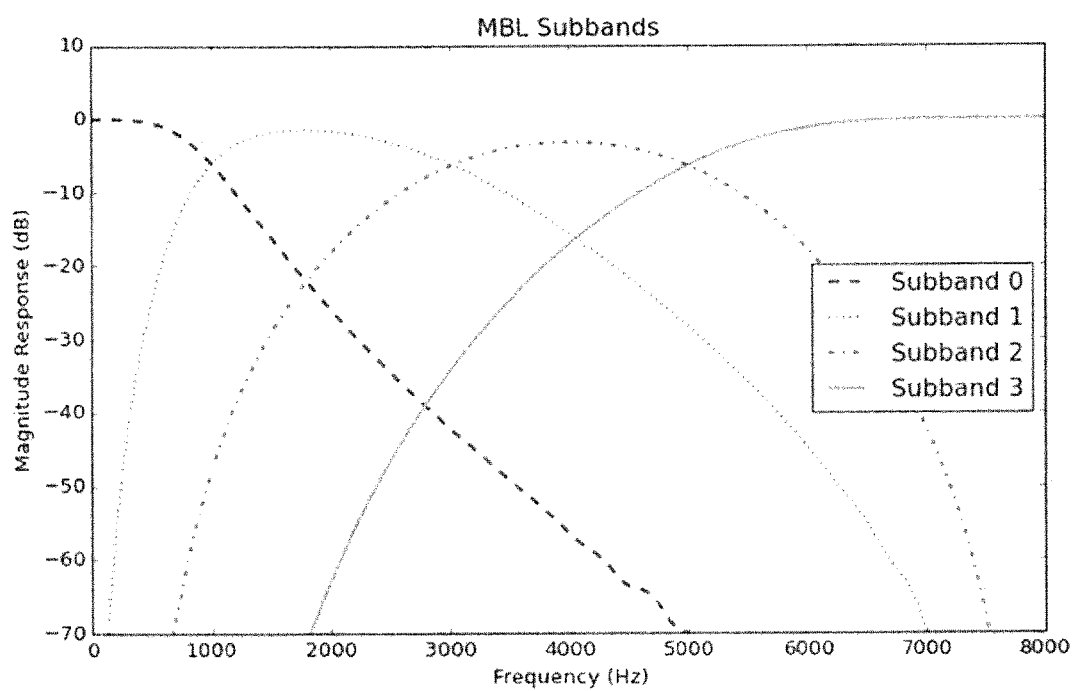
FIG. 2 is a magnitude response of a four-band structure.

FIG. 2 shows the magnitude responses H_b(f) of a four band structure, where the cutoff frequencies occur at about 1000, 3000 and 5000 Hz. Here, four bands split the frequency spectrum into two high and two low bands that when summed together render the full spectrum that has a flat magnitude response of 1 (0 dB) across frequency.

Eq. 3 expresses the magnitude response at the output of band "b" to an input signal with magnitude response X(f) (e.g., a representative speech signal) prior to limiting.

$$X(f)*H\_b(f) \qquad \text{Eq. 3}$$

The multiband compressor/limiter threshold T_b is derived by equation 4.

$$T\_b=\text{alpha}*\min\_f(A(f), fLo\_b<f<fUp\_b) \qquad \text{Eq. 4}$$

Here, min_f means the system derives the minimum of the argument across a frequency range. A(f) is the maximum amplitude driven out of the active loudspeaker 104 (or active transducer) subject to the distortion constraint and fLo_b and fUp_b define the upper and lower frequency limits of the band, e.g. where the magnitude response H_b(f) drops below −6 dB or −20 dB, for example. Eq. 4 ensures that an input signal with frequency "f" will never causes the limited output level of band "b" to exceed the maximum amplitude "A(f)" regardless of the level of the input signal. In Eq. 4, alpha is a constant (e.g., 0.5) that may vary with frequency in alternate systems. Alpha is not dependent on the active loudspeaker or set up; rather, it determines how conservative the system will control loudness in an enclosure, a room, or a vehicle.

In EQ. 4, T_b establishes a threshold for each band; that is, the maximum output level of each band that will satisfy the distortion criteria. Effectively, Eq. 4, translates the maximum amplitude "A" which is dependent on frequency to a limiter threshold "T", which is dependent on the index of the band "b". When this threshold is met, the system ensures that the distortion constraint is satisfied and the one or more multiband limiters/compressors operate in the linear range. As expressed, the value of the threshold "T" will depend on the number of bands in use or the cutoff frequencies between that are optimized.

Let Y_b(f) be the magnitude response of the output of band "b" after limiting or compression, in response to an input signal "X(f)", which is expressed approximately by Eq. 5.

$$Y\_b(f)=\text{MIN}(X(f)*H\_b(f), T\_b) \qquad \text{Eq. 5}$$

In Eq. 5, Y_b(f) takes the minimum of two terms: the first term is the magnitude response of band "b" prior to limiting (X(f)*H_b(f)); the second is multiband compressor/limiter threshold T_b.

When the system sums up the magnitude response across all of the bands it renders the magnitude response of the multiband compressor/limiter as expressed in EQ. 6.

$$Y(f)=Y(f, B, fc\_1, \ldots fc\_(B-1))=\text{Sum}\_b Y\_b(f) \qquad \text{Eq. 6}$$

In EQ. 6, Y(f) is a function of the original number of bands "B" and values of the crossover frequencies, fc_b.

A loudness difference can be calculated by comparing the input X(f) to the output Y(f). Various metrics may execute the comparison such as A-weighted Sound Pressure Level (SPL), and ITU-T P.79 for telephony. In this system, L(X, Y) is a function for computing loudness difference between two signals with magnitude responses X(f) and Y(f). In some systems, L(X, Y) may be a perceptually frequency-weighted (W(f)) function that is expressed by Eq. 7.

$$L(X,Y)=\log(\text{Sum}\_f W(f)X(f))-\log(\text{Sum}\_f W(f)Y(f)) \qquad \text{Eq. 7}$$

EQ. 7 computes the loudness difference of two signals X and Y or L(X, Y). Here, the weighting function W(f) deemphasizes the low frequencies and emphasizes the higher frequencies, for example, in accordance with a Zwicker loudness model. Further, the log function models the roughly logarithmic relationship between level and perceptual judgement of loudness.

With L(X, Y) defined as a difference in loudness between the original input signal X(f) and the output of the compressor or limiter Y(f), the system attempts to minimize L(X, Y) so that the loudness of the signal is minimally reduced by the compressor or limiter. Thus, Eq. 8 expresses a model subject to optimization.

$$\text{argmin}\{B, fc\_1, \ldots fc\_(B-1)\} L(X, Y(B, fc\_1, \ldots fc\_(B-1))) \qquad \text{Eq. 8}$$

The argmin function indicates that the minimum of L(X, Y) is searched for across the entire parameter space of the set of tunable parameters {B, fc_1, . . . fc_(B−1)}. The optimization of parameters is executed by a gradient descent, a simplex method, or a systematic evaluation of solutions via a computer-based brute force search technique, for example. The result computes the number of bands "B" and crossover frequencies fc_b that are derived such that the reduction in loudness is minimized for a representative signal X, and a compressed or limited signal Y defined per Eq. 6, subject to the distortion constraint expressed in Eq. 1. In some systems, optimization occurs by multiple programming loops, or by other automated optimization techniques.

Figure 3:
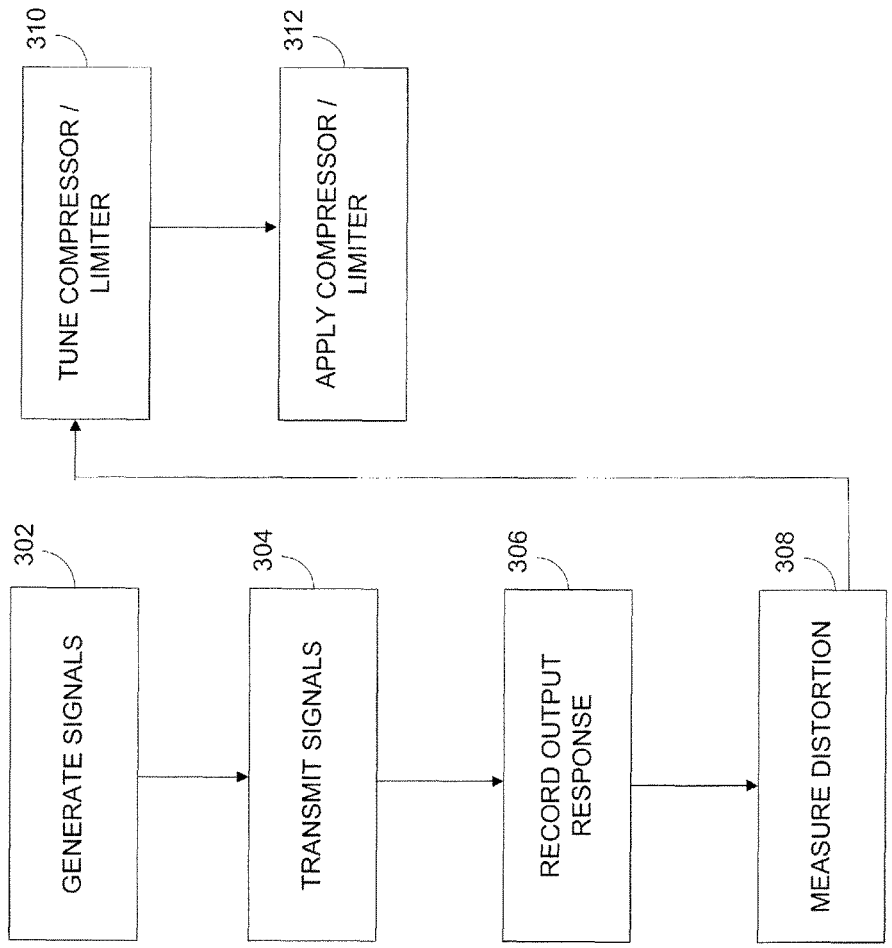
FIG. 3 is a multiband compressor/limiter tuning process.

In operation, the system may optimize one or more multiband audio limiters and/or compressors by the process of FIG. 3. In FIG. 3, an audio source generates and renders one or more test loudspeaker signals that vary in frequency and amplitude that drive an active loudspeaker at 302 and 304. The process receives and records the active loudspeaker response through one or more microphones at 306. At 308, the process measures the distortion of the active loudspeaker relative to the frequency and amplitude by one or more of the processes described above. At 310, the process calculates and tunes the multiband compressor/limiter parameters automatically. The tuned parameters may include one or more crossover frequencies, amplitude thresholds, compression ratios, time constants, attack and release time periods, look-ahead parameters, etc. At optional 312, the process applies the one or more tuned audio compressors/limiters to a loudspeaker signal to prevent loudspeaker distortion and in some instances, microphone distortion.

Figure 4:
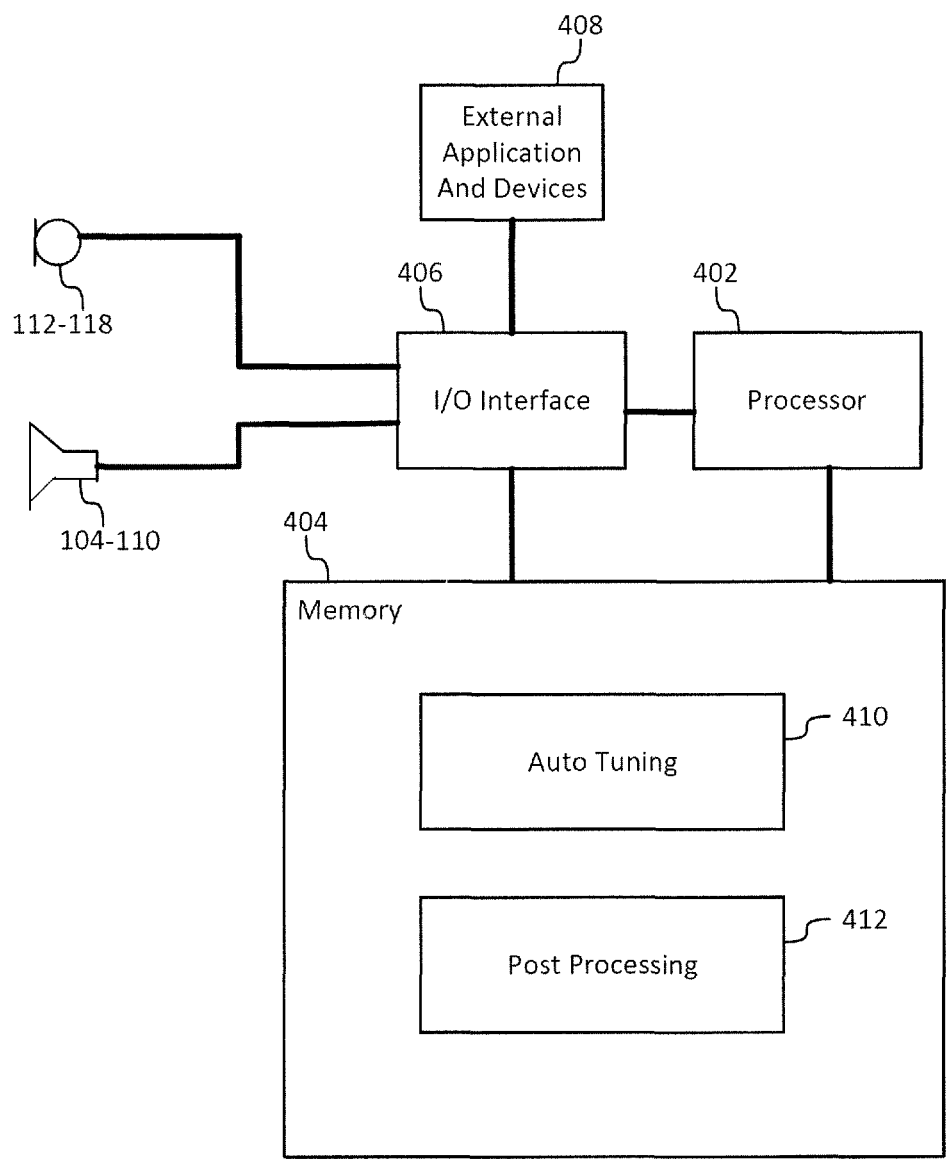
FIG. 4 is vehicle with multiband compressor/limiter tuning system.

FIG. 4 is a block diagram of a vehicle with a multiband compressor/limiter tuning system. The system comprises a processor 402, a non-transitory media such as a memory 404 (the contents of which are accessible by the processor 402) and an I/O interface 406. The I/O interface 406 connects devices and local and/or remote applications such as, for example, additional microphones, audio transducers or loudspeakers, and AEC and feedback suppression applications. The memory 404 may store instructions which when executed by the processor 402 causes the system to render some or all of the functionality associated with the tuning of multiband compressor/limiter as described herein. For example, the memory 404 may store instructions which when executed by the processor 402 causes the system to render the functionality associated with post processing 408 (e.g., AEC, feedback suppression, etc.) and calculating, and tuning the multiband compressor/limiter parameters 410. The tuning parameters may include one or more crossover frequencies, amplitude thresholds, compression ratios, time constants, attack and release times, look-ahead parameters, etc.

The processors 402 may comprise a single processor or multiple processors that may be disposed on a single chip, on multiple devices, or distributed over more than one system. The processors 402 may be hardware that executes computer executable instructions or computer code embodied in the memory 404 or in other memory to perform one or more features of the systems described herein. The processor 402 may include a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 404 and/or storage disclosed may retain an ordered listing of executable instructions for implementing the functions described above. The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random Access Memory (RAM), a Read-Only Memory (ROM), an Erasable Programmable Read-Only Memory (EPROM or Flash memory), or a database management system. The memory 404 may comprise a single device or multiple devices that may be disposed on one or more dedicated memory devices or on a processor or other similar device. When functions or steps are said to be "responsive to" or occur "in response to" a function or a process, the device functions or steps necessarily occur as a result of the function or message. It is not sufficient that a function or act merely follow or occur subsequent to another. Further, when functions indicate an automated echo cancellation occurs, echo is removed by subtracting an estimated echo from the transmitted or received signal.

The memory 404 may also store a non-transitory computer code, executable by processor 402. The computer code may be written in any computer language, such as C, C++, assembly language, channel program code, and/or any combination of computer languages. The memory 404 may store information in data structures including, for example multiband compressor/limiter tunable parameters including one or more one or more crossover frequencies, amplitude thresholds, compression ratios, time constants, attack and release times, look-ahead parameters, etc.

The functions, acts or tasks illustrated in the figures or described may be executed in response to one or more sets of logic or instructions stored in or on non-transitory computer readable media as well. The functions, acts or tasks are independent of the particular type of instructions set, storage media, processor or processing strategy and may be performed by software, hardware, integrated circuits, firmware, micro code and the like, operating alone or in combination. In one embodiment, the instructions are stored on a removable media device for reading by local or remote systems. In other embodiments, the logic or instructions are stored in a remote location for transfer through a computer network or over wireless or tangible telephone or communication lines. In yet other embodiments, the logic or instructions may be stored within a given computer such as, for example, a CPU.

The systems and processes reinforce and enhance sound reproduction without distortion. The systems may automatically tune one, more, or all of multiband compressors and/or limiters bands without applying subjective testing criteria. The system tunes all or some of the one or more audio compressors and/or limiters consistently across many devices that may occur in many different vehicle models. The system can be implemented within vehicle systems such as an infotainment processor and digital signal processors or DSPs and co-exist and communicate with other system software. A vehicle may include without limitation, a car, bus, truck, tractor, motorcycle, bicycle, tricycle, quadricycle, or other cycle, ship, submarine, boat or other watercraft, helicopter, drone, airplane or other aircraft, train, tram or other railed vehicle, spaceplane or other spacecraft, and any other type of vehicle whether currently existing or after-arising this disclosure. In other words, it comprises a device or structure for transporting persons or things. The system is easy and quickly adapted to different vehicle and cabin types and different acoustic environments configurations.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A method that automates the tuning of a multiband compressor that minimizes loudspeaker distortion comprising:
   playing one or more test loudspeaker signals that vary in frequency and in amplitude out of a loudspeaker;
   recording the responses of the loudspeaker at a microphone;
   measuring a distortion of the loudspeaker, relative to a frequency and an amplitude, with respect to the one or more test loudspeaker signals and a microphone signal; and
   calculating a plurality of tunable parameters of the multiband compressor that includes a plurality of frequency bands of the one or more test loudspeaker signals and cutoff frequencies of the multiband compressor in response to the measured distortion and a loudness difference between the one or more test loudspeaker signals and the microphone signal.

2. The method of claim 1 further comprising programming the tunable parameters of the multiband compressor.

3. The method of claim 1 where the one or more test loudspeaker signals comprises pure tones, sweeps and noise bursts of varying amplitude.

4. The method of claim 1 where the measured distortion comprises at least one of a total harmonic distortion measurement and a total harmonic distortion plus noise measurement.

5. The method of claim 1 where the tunable parameters comprise a plurality of amplitude thresholds, a plurality of compression ratios, and a plurality of time constants.

6. The method of claim 1 where the act of calculating of the tunable parameters include comparing the measured distortion against a scalar distortion limit.

7. The method of claim 1 where the act of calculating of the tunable parameters include comparing the measured distortion against a frequency dependent distortion limit.

8. The method of claim 1 where the act of calculating tunable parameters comprises optimizing a plurality of compressor parameters.

9. The method of claim 8 where the act of optimizing is based on a loudness reduction metric.

10. The method of claim 8 where the act of optimizing comprises executing a gradient descent.

11. The method of claim 8 where the act of optimizing comprises executing a simplex method.

12. The method of claim 1 where the microphone signal is further processed by an echo suppressor.

13. The method of claim 1 where the microphone signal is further processed by a feedback suppressor.

14. A non-transitory machine-readable medium encoded with machine-executable instructions, wherein execution of the machine-executable instructions is for:
   playing one or more test loudspeaker signals that vary in frequency and in amplitude out of a loudspeaker;
   recording the responses of the loudspeaker at a microphone;
   measuring a distortion of the loudspeaker, relative to a frequency and an amplitude, with respect to the one or more test loudspeaker signals and a microphone signal; and
   calculating tunable parameters of the multiband compressor that includes a plurality of frequency bands of the one or more test loudspeaker signals and cutoff frequencies of the multiband compressor in response to the measured distortion and a loudness difference between the one or more test loudspeaker signals and the microphone signal.

15. The non-transitory machine-readable medium of claim 14 further comprising applying tunable parameters of the multiband compressor.

16. The non-transitory machine-readable medium of claim 14 where the act of measuring a distortion of the loudspeaker comprises measuring at least one of a total harmonic distortion measurement and a total harmonic distortion plus noise measurement.

17. The non-transitory machine-readable medium of claim 14 where the tunable parameters comprise a plurality of amplitude thresholds, a plurality of compression ratios and a plurality of time constants.

18. The non-transitory machine-readable medium of claim 14 where the calculating of the tunable parameters include comparing the measured distortion against a frequency dependent distortion limit.

19. A system that that automates the tuning of a multiband compressor that minimizes loudspeaker distortion comprising:
   a loudspeaker configured to render an output in response to one or more test loudspeaker signals that vary in frequency and vary in amplitude;
   a microphone for recording the responses of the loudspeaker;
   a processor programmed to measure a distortion of the loudspeaker, relative to a frequency and an amplitude, with respect to the one or more test loudspeaker signals and a microphone signal; and
   the processor further configured to calculate tunable parameters of the multiband compressor that includes a plurality of frequency bands of the one or more test loudspeaker signals and cutoff frequencies of the multiband compressor in response to the measured distortion and a loudness difference between the one or more test loudspeaker signals and the microphone signal.

20. The system of claim 19 where the system comprises a vehicle.

* * * * *